United States Patent [19]
Allen et al.

[11] Patent Number: 6,140,171
[45] Date of Patent: Oct. 31, 2000

[54] FET DEVICE CONTAINING A CONDUCTING SIDEWALL SPACER FOR LOCAL INTERCONNECT AND METHOD FOR ITS FABRICATION

[75] Inventors: Archibald John Allen, Shelburne; Jerome Brett Lasky, Essex Junction; Randy William Mann, Jericho; John Joseph Pekarik, Underhill; Jed Hickory Rankin, Burlington; Edward William Sengle, Hinesburg; Francis Roger White, Essex Junction, all of Vt.

[73] Assignee: International Business Machines Corporation, Armonk, N.Y.

[21] Appl. No.: 09/233,549

[22] Filed: Jan. 20, 1999

[51] Int. Cl.$^7$ .................................................. H01L 21/336
[52] U.S. Cl. .......................... 438/230; 438/233; 257/900; 257/903; 257/344
[58] Field of Search .................. 257/382, 900, 257/903, 344, 773, 776; 438/230, 233, 303

[56] References Cited

U.S. PATENT DOCUMENTS

| | | | |
|---|---|---|---|
| 4,419,809 | 12/1983 | Riseman et al. | 29/571 |
| 4,532,532 | 7/1985 | Jackson | 357/15 |
| 4,833,094 | 5/1989 | Kenney | 437/47 |
| 4,890,141 | 12/1989 | Tang et al. | 357/23.3 |
| 4,939,567 | 7/1990 | Kenney | 357/42 |
| 4,984,048 | 1/1991 | Sagara et al. | 357/34 |
| 5,060,035 | 10/1991 | Nishimura et al. | 357/23.7 |
| 5,146,291 | 9/1992 | Watabe et al. | 357/23.4 |
| 5,220,182 | 6/1993 | Matsuoka et al. | 257/67 |
| 5,363,327 | 11/1994 | Henkles et al. | 365/149 |
| 5,373,178 | 12/1994 | Motoyoshi et al. | 257/344 |
| 5,386,133 | 1/1995 | Hiroki et al. | 257/344 |
| 5,521,118 | 5/1996 | Lam et al. | 437/180 |
| 5,656,830 | 8/1997 | Zechman | 257/784 |
| 5,691,549 | 11/1997 | Lam et al. | 257/282 |
| 5,741,735 | 4/1998 | Violette et al. | 438/279 |
| 5,780,896 | 7/1998 | Ono | 257/344 |
| 5,780,901 | 7/1998 | Yoshitomi et al. | 257/336 |

OTHER PUBLICATIONS

Bhatia et al, Process for Making Sidewall Resistors with Single Crystal Contacts, *IBM Technical Disclosure Bulletin* 26 (2), Jul. 1983: 623–625.

Jambotkar, Submicrometer–Wide Polysilicon Resistors, *IBM Technical Disclosure Bulletin* 25 (9), Feb. 1983: 4785–4788.

Spacer–Defined Strap, *IBM Technical Disclosure Bulletin* 32 (4B), Sep. 1989: 321–322.

*Primary Examiner*—Donald L. Monin, Jr.
*Attorney, Agent, or Firm*—Pollock, Vande Sande & Amernick; Howard J. Walter, Jr.

[57] ABSTRACT

A FET device comprising a semiconductor substrate; diffusion regions in the substrate separated by a channel region; a gate overlapping the channel region and a portion of the diffusion regions and separated from the substrate by a gate dielectric; and a sidewall dielectric on a sidewall of the gate; and a sidewall spacer conductor on the sidewall dielectric contacting one of the diffusion regions but not both of the diffusion regions of one device is provided along with a method for its fabrication. The conductive spacer connects diffusions of adjacent devices that share a common gate electrode.

25 Claims, 3 Drawing Sheets

FET DEVICE CONTAINING A CONDUCTING SIDEWALL SPACER FOR LOCAL INTERCONNECT AND METHOD FOR ITS FABRICATION

TECHNICAL FIELD

The present invention is concerned with providing a FET device having a conducting sidewall spacer for providing a local electrical interconnect. The present invention provides a sidewall spacer conductor that connects one of the source or drain diffusion regions. In addition, the present invention is concerned with a method to fabricate a FET having a sidewall spacer conductor for providing local interconnect. The present invention is especially applicable for SRAM cells.

BACKGROUND OF INVENTION

In the formation of semiconductor devices, it is necessary to provide both desired electrical contact between certain regions of the devices formed and also to prevent contact between various other regions of the devices formed on the substrate. One technique for accomplishing this has been by using photoresist and masking techniques wherein those areas to be exposed for electrical contact are patterned in the photoresist, and then the pattern developed in the photoresist, to thereby expose the desired underlying regions. This technique normally requires several successive masks and thin film depositions and film etches to perform the entire process, and in this performance each succeeding mask must be precisely aligned to the previous photolithographic levels. However, as the technology advances, requiring the formation of smaller and smaller features, it is increasingly difficult to maintain precise overlay tolerance, with the result that even small misalignments of the masks will result in the exposure of small portions or "borders" of regions that are intended to remain covered. Hence, electrical connections, e.g. by an overlay deposition of a metal, will connect not only the desired locations, but also those exposed border portions of the undesired locations.

In the case of, for instance, SRAM cells, a limiting factor for shrinking the cells is the contact to diffusion with respect to the gate conductor and the wiring needed in conjunction with the contact. This limiting factor ensures that the diffusion contact does not electrically short to the gate conductor. Typical methods used to solve this problem are polysilicon cross-coupling incorporating a buried contact, which requires at least two critical masking levels, and tungsten stud and metal wiring, which also requires at least two critical masking levels and associated processing. Both of these techniques require a significant amount of silicon space, thus increasing the SRAM cell size.

SUMMARY OF INVENTION

The present invention provides for a sub-lithographic wiring feature along with the method for creating such. Moreover, the present invention is especially applicable for SRAM applications and provides for increased overlap capacitance for improved soft error rate (SER) immunity. SER refers to memory cell data loss due to incident ambient radiation. More particularly, the present invention is concerned with a FET device that comprises a semiconductor substrate, diffusion regions in the substrate separated by a channel region, and a gate overlapping the channel region and a portion of the diffusion regions and being separated from the semiconductor substrate by a gate dielectric. A sidewall dielectric is present on the sidewalls of the gate and a sidewall spacer electrical conductor is adjacent to the sidewall dielectric and connected to either one or the other of the diffusion regions but not both. The conductive spacer can be used to connect diffusions on adjacent devices that share a common gate electrode.

In addition, the present invention is concerned with a method for fabricating the above disclosed FET device. In particular, the process of the present invention comprises providing a semiconductor substrate, forming diffusion regions in the semiconductor substrate, forming a gate dielectric layer on the semiconductor substrate, and forming a gate on the gate dielectric layer and overlapping the diffusion regions. A first dielectric layer is formed on at least one sidewall of the gate. A second and different sidewall spacer layer is formed on the first dielectric layer. A barrier layer is formed on at least one of the diffusion regions, abutting the second dielectric layer. The second sidewall spacer layer is removed, including exposing a portion of at least one of the diffusion regions beneath the second dielectric layer. A sidewall spacer electrical conductor is formed on the first dielectric layer and connecting the exposed portion of one of the diffusion layers.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures which illustrate a diagrammatic representation of the steps of one embodiment of the present invention.

Figure 1:
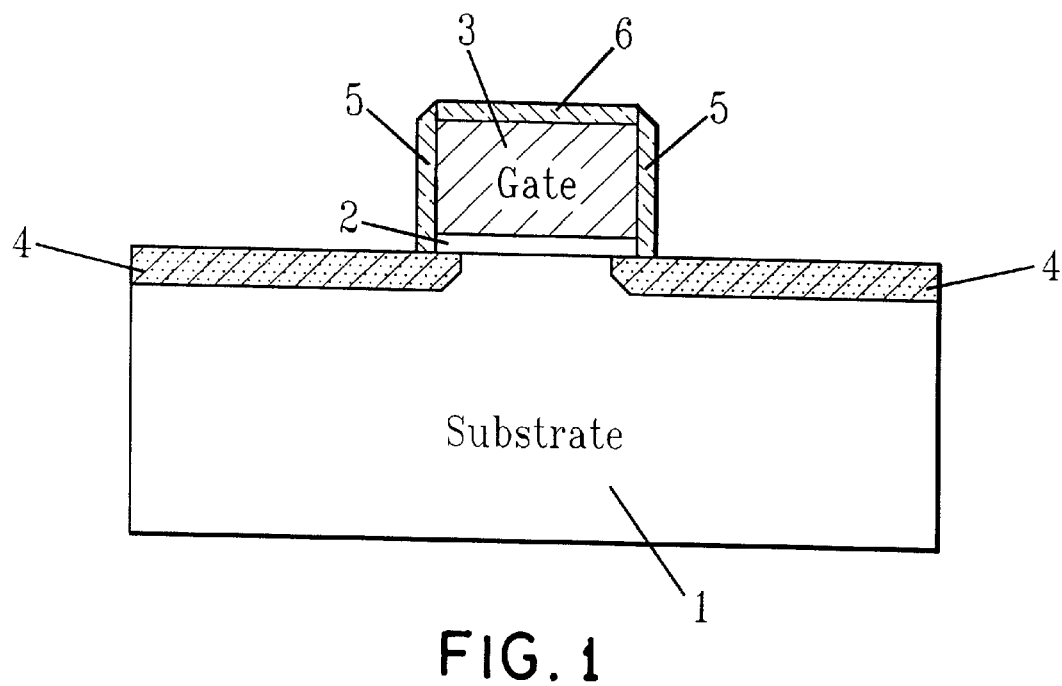
FIGS. 1–6 are schematic diagrams of the structure in varying stages of the processing according to an embodiment of the present invention.

According to the present invention as illustrated in FIG. 1, a first insulating layer 2 is provided on a semiconductor substrate 1. The semiconductor substrate 1 is typically silicon but can be any other semiconductor material such as a Group III-V semiconductor. The insulating layer acts as a gate insulator and is typically about 20 Å to about 350 Å thick and more typically about 30 Å to about 100 Å thick. The insulating layer is provided and defined by well known techniques and need not be described herein in any great detail. A particular method of growing the insulating layer is by thermal oxidation of the underlying substrate 1 to provide a silicon dioxide. In the alternative, such can be deposited by chemical vapor deposition (CVD) or physical vapor deposition (PVD).

A conductive material 3 such as doped polycrystalline silicon is provided and defined for forming the gate electrodes in the semiconductor device. Typically, the conductive layer 3 is about 500 Å to about 4000 Å thick, and more typically about 1500 Å to about 3000 Å thick.

Also provided in the semiconductor substrate 1 are source and drain diffusion regions 4. As shown, the gate electrodes overlap the source and drain regions 4. Gate sidewall insulating spacer layers 5 are provided such as by chemical vapor deposition of silicon nitride and/or silicon dioxide followed by an anisotropic etch. Typically, the spacer regions 5 are about 50 to about 3000 Å thick, and more typically about 300 to about 1500 Å thick. If desired, the top of the gate electrode can be capped with an insulator 6 such as silicon nitride and/or silicon dioxide. This layer 6 when present is typically about 100 to about 3000 Å thick and more typically about 500 to about 1500 Å thick. The configuration as illustrated in FIG. 1 can be achieved by well known techniques and need not be described herein in any further detail.

Figure 2:
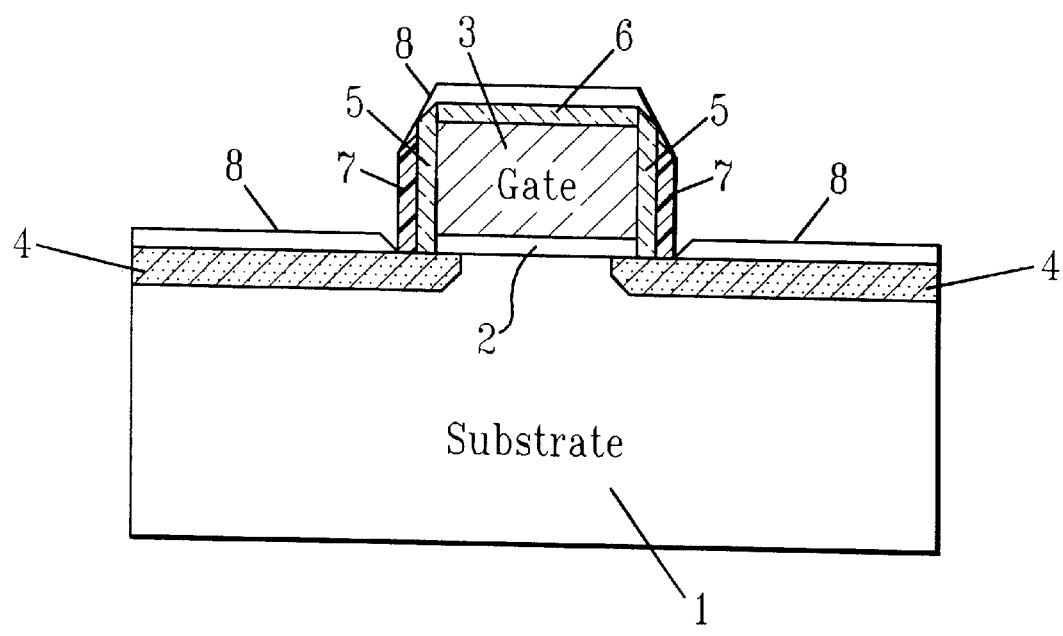

Next, a conformal layer 7 is deposited and then etched to form spacers on the sidewall spacers. This layer is of a different material than insulating spacer layer 5 and is preferably but not necessarily a dielectric. It must be removed under conditions that do not remove layer 5 to any significant extent. The use of a mandril spacer as illustrated in FIG. 2 is critical to the success of the present invention. An example of a suitable conformable spacer material is a parylene coating. Parylene polymers are obtainable from Union Carbide Corp. Suitable parylene coatings include parylene N, parylene C and parylene D. These polymers typically have average molecular weights of about 500,000 and a discussion of them can be found in the publication entitled "Novatran Corp. Parylene Conformal Coating Specification and Properties. P/N 400-0001-00" by Novatran Corp., the disclosure of which is incorporated herein by reference. Parylene is commercially available as a dimer. Parylene N is referred to as polyparaxylylene; parylene C is commonly referred to as monochloropolyparaxylylene and parylene D is dichloropolyparaxylylene. The coating can be applied by typical vapor deposition technique. The parylene is then subjected to an anisotropic etch to create the desired mandril spacer. Typical etch conditions include oxygen-rich plasmas. The spacer layer 7 is typically about 100 to about 2000 Å, more typically about 300 to about 1000 Å, a typical example being about 0.05 μm.

Figure 3:
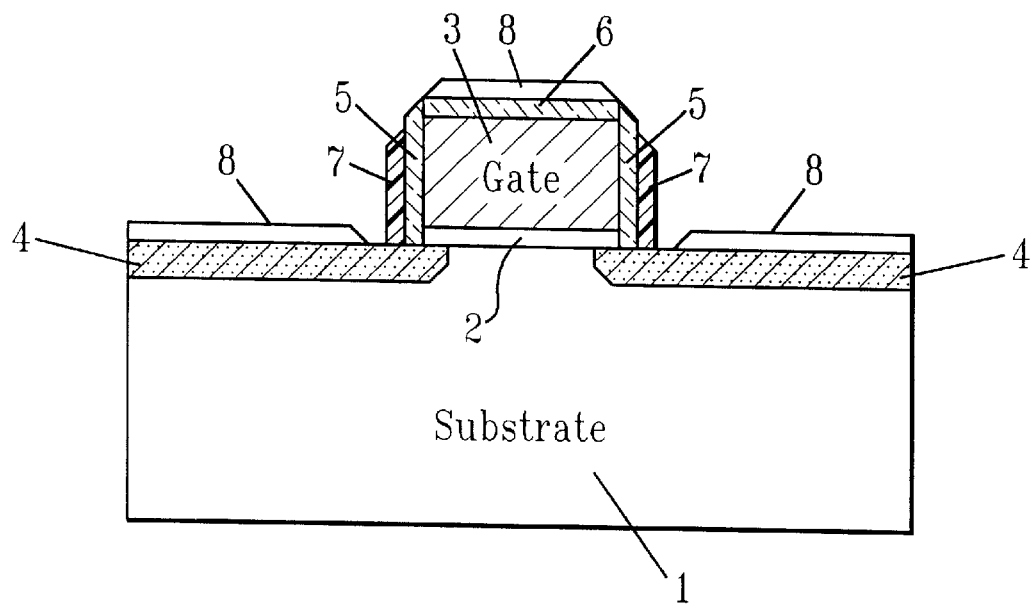

Next, optionally an insulating material 8 is non-conformally deposited such as a silicon dioxide. Such can be deposited by plasma deposition or by sputtering. The deposition is such that as little as possible of the insulator dioxide 8 is deposited on the sidewall of the parylene. The layer 8 is typically about 50 to about 1000 Å thick, more typically about 100 to about 500 Å thick, an example being about 100 Å. In order to assure that the spacer layer 7 is exposed, about 50 to about 200 Å of the nonconformal insulating layer 8 is removed by wet or dry etching. (See FIG. 3).

The spacer 7 is then removed. For example, in the case of parylene, such can be removed by an oxygen stripping process using an oxygen-rich isotropic plasma. Also, if desired for purposes of insuring that the silicon surface is free of oxide, a cleaning step such as a brief etching with dilute HF or fluorine-based plasma can be employed. After removal of the spacer layer 7, the substrate near the edge of the gate is exposed while the insulating layer is maintained everywhere else.

Figure 4:
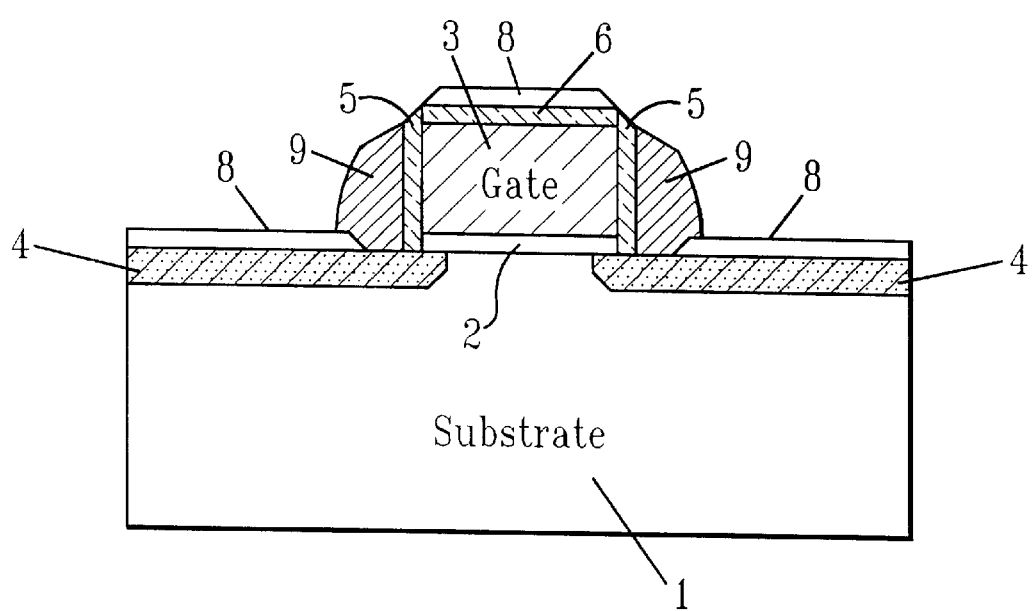

As shown in FIG. 4, an electrical conductor 9 is deposited and then etched selective to the insulating layer 8 so that the bottom of the metal spacer 9 completely covers the exposed substrate area and overlaps the insulating layer 8. This allows for subsequent etching of the metal layer 9 to stop on the insulating layer 8. Typical conductors that can be employed include metals such as tungsten, niobium, tantalum, and aluminum, with tungsten being preferred. Also, intermetallic compounds such as metal silicides and non-metallic materials such as doped polysilicon that nevertheless exhibit conductivity characteristics of the magnitude possessed by the above metals can be employed, if desired. Typically, the thickness of the metal is about 100 to about 2000 Å, more typically about 500 to about 1000 Å, an example being about 500 Å, the preferred metal being tungsten. The contact opening for the metal to contact the semiconductor substrate need only be a very small contact opening such as about 200 to about 2100 Å, and more typically about 350 to about 1100 Å.

In the case of tungsten, the etching selective to the underlying insulating layer when it is an oxide can employ a fluorine-based plasma.

Figure 5:
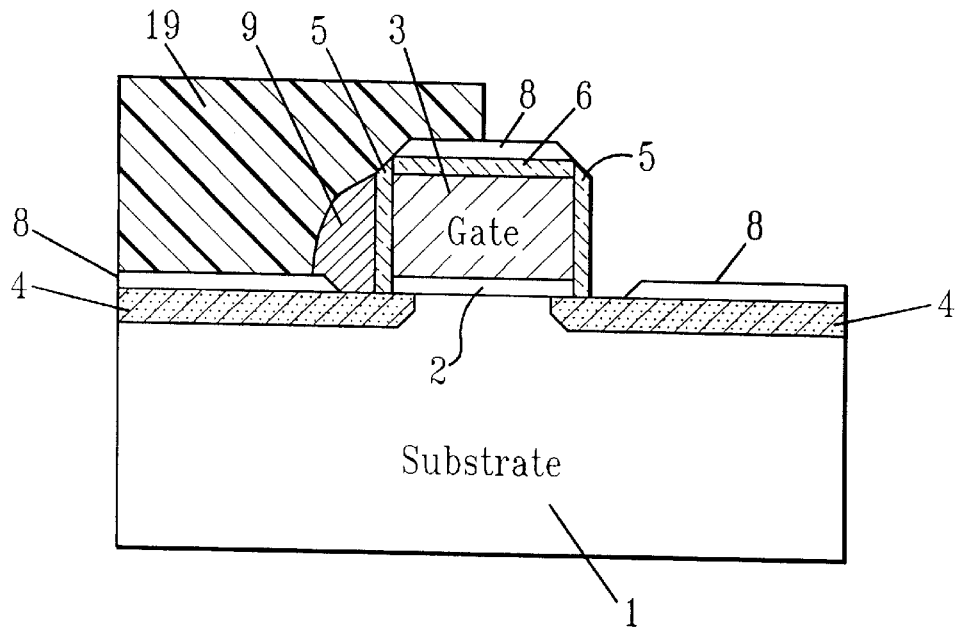

As illustrated in FIG. 5, a mask 19 is patterned using known photolithographic techniques to protect the metallic spacer 9 where it is desired to keep it and to expose the metallic spacer 9 where it is to be removed. That portion of the metallic spacer to be removed can be etched employing a peroxide, $H_2O_2$ diluted with water. Of course, other chemistries suited to the composition of the conductive spacer can be used.

Figure 6:
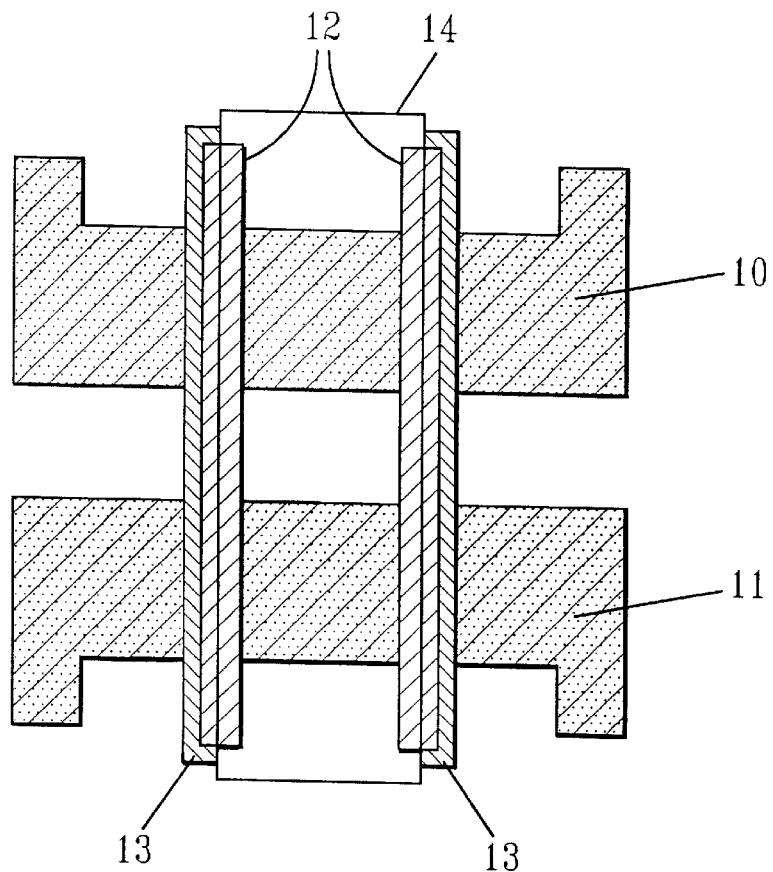

FIG. 6 illustrates an exemplary layout showing how conducting spacers could be used in a SRAM cell. In particular, 10 represents active regions of a first impurity type and 11 represents active impurities of a second and different impurity type such as a p type, numeral 12 represents the gate conductors and 13 represents the conducting spacers and 14 the spacer removal mask opening.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a FET device which comprises providing a semiconductor substrate; forming source and drain diffusion regions in said semiconductor substrate; forming a gate electrode on said semiconductor substrate overlapping said source and drain diffusion regions; providing a gate insulating layer located between said gate and said substrate; forming a first dielectric layer on at least one sidewall of said gate and a second and different sidewall spacer layer on the first dielectric layer wherein the second spacer layer is a parylene coating; forming a barrier layer, on at least one of the diffusion layers, abutting the second dielectric layer; removing the second spacer layer including exposing a portion of said at least one of the diffusion regions beneath said second dielectric layer; and forming a sidewall spacer conductor on the first dielectric layer contacting the exposed portion of said at least one of the diffusion regions.

2. The method of claim 1 wherein the second spacer layer has a thickness of about 300 to about 1000 Å.

3. The method of claim 1 wherein the first dielectric layer is silicon nitride.

4. The method of claim 1 wherein the barrier layer is a nonconformal oxide layer.

5. The method of claim 4 wherein the oxide layer is about 100 to about 500 Å thick.

6. The method of claim 1 wherein the sidewall spacer conductor is selected from the group consisting of tungsten, tantalum, niobium, and aluminum.

7. The method of claim 1 wherein the sidewall spacer conductor is tungsten.

8. The method of claim 1 which comprises forming the first dielectric layer on both sidewalls of the gate and the second spacer layer on the first dielectric layer on both sidewalls; forming a barrier layer on both of the source and drain diffusion regions, abutting the second spacer layer; removing the second spacer layer including exposing a portion of both of the diffusion regions beneath it; forming a sidewall spacer conductor on the first dielectric layer contacting the exposed portion of both of the diffusion regions.

9. The method of claim 1 which comprises removing sidewall spacer conductor from contacting one of the diffusion regions while leaving it to contact the other of the diffusion regions.

10. A method for fabricating a FET device which comprises providing a semiconductor substrate; forming source and drain diffusion regions in said semiconductor substrate; forming a gate electrode on said semiconductor substrate overlapping said source and drain diffusion regions; providing a gate insulating layer located between said gate and said substrate; forming a first dielectric layer on both sidewalls of said gate and a second and different sidewall spacer layer on the first dielectric layer on both sidewalls; forming a barrier layer on both of the source and drain diffusion layers, abutting the second spacer layer; removing the second spacer layer including exposing a portion of both of the diffusion regions beneath it; and forming a sidewall spacer conductor on the first dielectric layer contacting the exposed portion of both of the diffusion regions.

11. The method of claim 10 wherein the second spacer layer has a thickness of about 300 to about 1000 Å.

12. The method of claim 10 wherein the first dielectric layer is silicon nitride.

13. The method of claim 10 wherein the barrier layer is a nonconformal oxide layer.

14. The method of claim 13 wherein the oxide layer is about 100 to about 500 Å thick.

15. The method of claim 10 wherein the sidewall spacer conductor is selected from the group consisting of tungsten, tantalum, niobium, and aluminum.

16. The method of claim 10 wherein the sidewall spacer conductor is tungsten.

17. The method of claim 10 which comprises removing sidewall spacer conductor from contacting one of the diffusion regions while leaving it to contact the other of the diffusion regions.

18. The method of claim 17 wherein the second spacer layer is a parylene coating.

19. A method for fabricating a FET device which comprises providing a semiconductor substrate; forming source and drain diffusion regions in said semiconductor substrate; forming a gate electrode on said semiconductor substrate overlapping said source and drain diffusion regions; providing a gate insulating layer located between said gate and said substrate; forming a first dielectric layer on at least one sidewall of said gate and a second and different sidewall spacer layer on the first dielectric layer; forming a barrier layer, on at least one of the diffusion layers, abutting the second dielectric layer; removing the second spacer layer including exposing a portion of said at least one of the diffusion regions beneath said second dielectric layer; and forming a sidewall spacer conductor on the first dielectric layer contacting the exposed portion of said at least one of the diffusion regions; and which comprises removing sidewall spacer conductor from contacting one of the diffusion regions while leaving it to contact the other of the diffusion regions.

20. The method of claim 19 wherein the second spacer layer has a thickness of about 300 to about 1000 Å.

21. The method of claim 19 wherein the first dielectric layer is silicon nitride.

22. The method of claim 19 wherein the barrier layer is a nonconformal oxide layer.

23. The method of claim 22 wherein the oxide layer is about 100 to about 500 Å thick.

24. The method of claim 19 wherein the sidewall spacer conductor is selected from the group consisting of tungsten, tantalum, niobium, and aluminum.

25. The method of claim 19 wherein the sidewall spacer conductor is tungsten.

* * * * *